United States Patent

Haugan et al.

Patent Number: 6,118,538
Date of Patent: *Sep. 12, 2000

[54] METHOD AND APPARATUS FOR ELECTRONIC COMPONENT LEAD MEASUREMENT USING LIGHT BASED SENSORS ON A COMPONENT PLACEMENT MACHINE

[75] Inventors: Carl E. Haugan; Jeffrey A. Jalkio, both of Saint Paul; Steven K. Case, Saint Louis Park, all of Minn.

[73] Assignee: CyberOptics Corporation, Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/938,244

[22] Filed: Sep. 26, 1997

Related U.S. Application Data

[63] Continuation of application No. 08/372,567, Jan. 13, 1995, abandoned.

[51] Int. Cl.[7] .................................................. G01B 11/24
[52] U.S. Cl. .......................... 356/375; 356/376; 356/394; 250/559.34
[58] Field of Search ...................... 356/375, 376, 356/394, 237, 386, 387, 237.1, 237.2, 237.3, 237.4, 237.5; 348/187, 189, 87, 126; 29/720, 721, 729, 739, 740–742; 33/549, 561; 250/572, 560, 561, 571, 559.34

[56] References Cited

U.S. PATENT DOCUMENTS

| | | |
|---|---|---|
| 3,636,635 | 1/1972 | Lemelson . |
| 3,854,052 | 12/1974 | Asar et al. ................................ 250/560 |
| 3,905,705 | 9/1975 | Petrohilos . |
| 4,074,938 | 2/1978 | Taylor . |
| 4,553,843 | 11/1985 | Langley et al. .......................... 356/375 |
| 4,585,350 | 4/1986 | Pryor . |
| 4,615,093 | 10/1986 | Tews et al. ................................ 29/407 |
| 4,741,621 | 5/1988 | Taft et al. ................................ 356/376 |
| 4,812,666 | 3/1989 | Wistrand .................................. 250/561 |
| 4,875,778 | 10/1989 | Luebbe et al. ........................... 356/394 |
| 4,959,898 | 10/1990 | Landman et al. .......................... 29/705 |
| 5,046,851 | 9/1991 | Morgan .................................... 356/375 |
| 5,114,229 | 5/1992 | Hideshima .............................. 356/237 |
| 5,114,230 | 5/1992 | Pryor ...................................... 356/384 |
| 5,162,866 | 11/1992 | Tomiya et al. .......................... 356/237 |
| 5,278,634 | 1/1994 | Skunes et al. . |
| 5,309,223 | 5/1994 | Konicek et al. .......................... 356/375 |
| 5,331,406 | 7/1994 | Fishbaine et al. ....................... 356/375 |
| 5,384,956 | 1/1995 | Sakurai et al. . |

FOREIGN PATENT DOCUMENTS

| | | |
|---|---|---|
| 2303751 | of 0000 | Japan . |
| 4-354066 | 12/1992 | Japan . |
| 5-196439 | 8/1993 | Japan . |
| 6-083945 | 3/1994 | Japan . |
| 6-115685 | 4/1994 | Japan . |
| 6-249629 | 9/1994 | Japan . |
| 6-249630 | 9/1994 | Japan . |
| 6-307831 | 11/1994 | Japan . |
| 8-116198 | 5/1996 | Japan . |
| 1370456 | of 0000 | U.S.S.R. . |
| 2183820A | of 0000 | United Kingdom . |

*Primary Examiner*—Hoa Q. Pham
*Attorney, Agent, or Firm*—Patterson & Keough, P.A.

[57] ABSTRACT

The present invention is a light based detection system for providing a low cost, very fast and very accurate measurements of lead positions and heights for integrated circuit board components. The alignment detections systems of the present invention are preferably located on a component placement head. The detector is a linear or rectangular array of pixels. The light path between the light source and the detector array is directed by the optical components across one or more leads in a plane that is neither parallel to nor perpendicular to the seating plane of the component. The light path is directed across the relevant leads without substantial interference from the body of the component or the other leads not being measured. A digital processor analyzes the measurements of the light sensitive detector to determine positions and/or coplanarity of the leads.

19 Claims, 12 Drawing Sheets

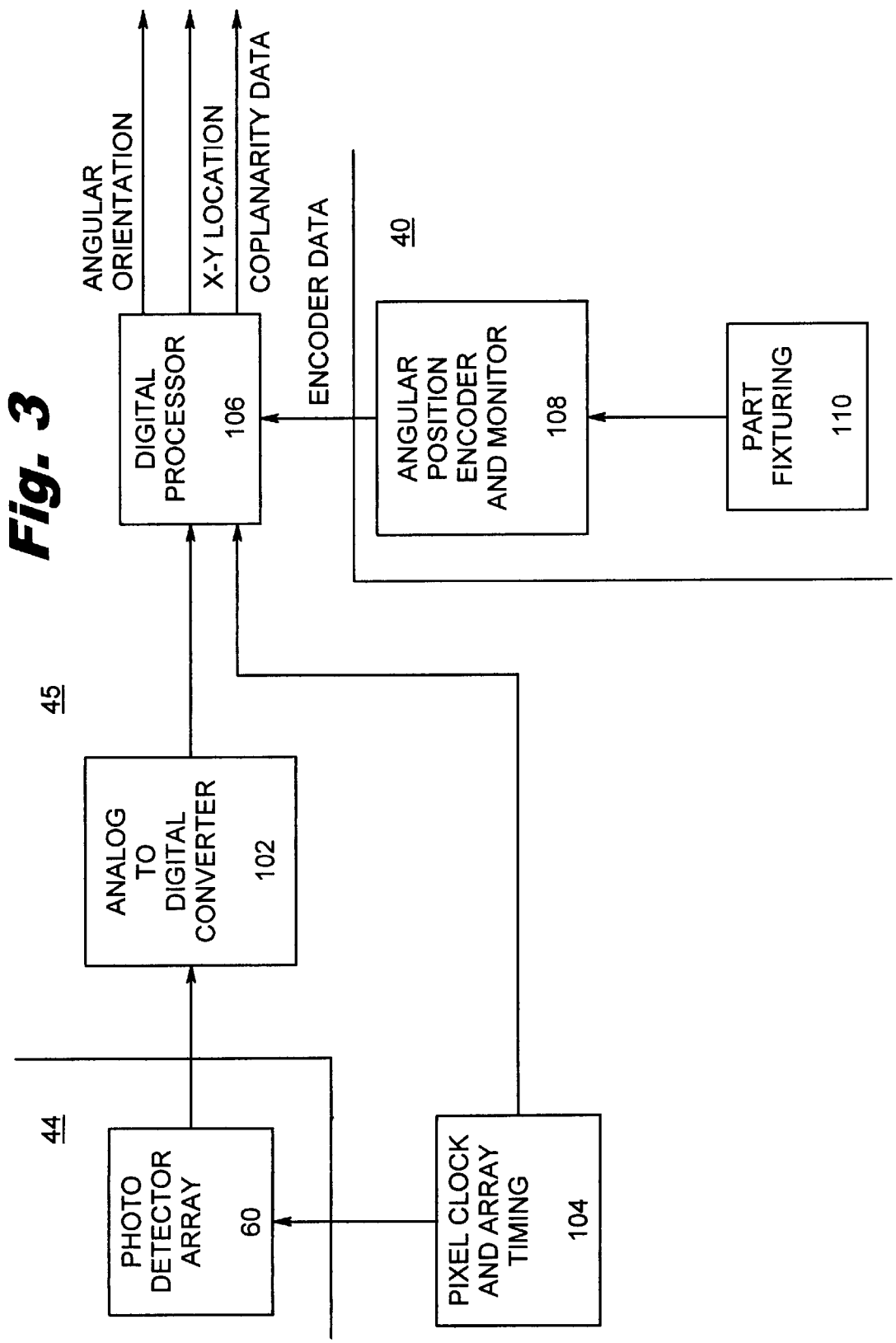

METHOD AND APPARATUS FOR ELECTRONIC COMPONENT LEAD MEASUREMENT USING LIGHT BASED SENSORS ON A COMPONENT PLACEMENT MACHINE

This is a Continuation of application Ser. No. 08/372,567 filed Jan. 13, 1995, now abandoned.

TECHNICAL FIELD

The present invention relates to optical detection systems for accurately sensing the position and condition of leads on integrated circuits or other components either prior to placement of the integrated circuit on a circuit board by a surface mount pick and place machine or independently on a lead measurement machine. More particularly, the invention relates to a non-contact light-based sensor system which can, with the highest degree of resolution, determine lateral orientation and coplanarity of leads for all such electronic components, even those having an ultra-fine pitch.

BACKGROUND OF THE INVENTION

Circuit boards that carry integrated electronic circuits as well as discreet electronic components are well known. To properly place an integrated circuit or other component on a circuit board, the leads of the component must be aligned to corresponding pads on the circuit board within a specified tolerance. The pattern of the pads on the circuit board is determined by the function of the circuit board and is designed on the circuit board prior to assembly. In order to place a component on the board, the position of each lead must be accurately measured and a fitting algorithm must be used to match the resulting lead pattern to the known pad pattern. This information is used to produce the correct angular orientation and lateral positioning of the component as it is placed in position.

Surface mounted circuit boards can carry many types of components including those with and without leads. Integrated circuit components (ICs) usually have leads on two or four sides of a rectangular body. Typical IC types include Quad Flat Packs (QFPs), Small Outline Integrated Circuits (SOICs), Plastic Leaded Chip Carriers (PLCCs) and Thin Small Outline Packages (TSOPs). Leads can be either gullwing shaped (QFPs, SOICs, TSOPs) or J-shaped (SOICs, PLCCs). Gull-winged leads are used to obtain a higher density of leads on a component, but J-shaped leads are more sturdy. Manufacturers are increasingly creating integrated circuits with even more delicate leads structured on tape, which are used in a process called tape automated bonding (TAB). Circuit boards can also carry leadless components, which have pads rather than leads that make contact with the circuit board, including Leadless Chip Carriers (LCCs), Ball Grid Array Chips (BGAs), Capacitors and Resistors.

The separation between centers of any pair of adjacent leads on electronic components is referred to as the pitch. Currently, a commonly manufactured lead separation is 0.025 inches (25 mil) pitch, meaning that the center of the leads are spaced at 25 thousandths of an inch intervals. Advances in component manufacturing technology, however, have produced integrated circuits having 15 and 10 mil pitches and TAB components have been created having several hundred leads spaced with a 4 mil pitch.

The bottom ends of the leads form a seating plane that will meet the plane formed by the pads on the circuit board when the component is placed in position. The height of the package body above the seating plane is called the package standoff. For some components the body extends down to the seating plane of the leads, i.e. the package standoff is essentially zero.

Solder paste is applied to the pads on the circuit board before the placement of the components. After the components are accurately placed on the solder paste, the circuit board is heated in an oven. When heated, the solder reflows and the component becomes electrically and mechanically attached to the board. Typically, solder paste is approximately 8 mils thick when applied and 4 mils thick upon cooling after reflowing. Accordingly, if one or more of the leads are bent above the nominal plane of the other leads by more than 4 mils, the bent lead likely will not connect through the solder to the circuit board, resulting in an open circuit.

The dimensions of components placed on circuit boards normally vary between 0.02 inch and 2.0 inches, although larger components may need to be accommodated. For quality manufacturing, component leads must be placed with at least 80% overlap of lead onto the corresponding pad of the circuit board. For example, a device having a 20 mil pitch generally has 10 mil wide leads. With an 80% overlap, at least 8 mils of the lead width must be on the pad with no more than 2 mils of the lead width off the pad. In general, sensing systems used to align parts for placement must have five to ten times better resolution than the accuracy required. Therefore, 0.2 to 0.4 mil image resolution is required to achieve the maximum placement error of 2 mils specified for quality manufacturing methods for a component with 20 mil pitch. Correspondingly smaller image resolution is required for components with smaller pitch.

To perform this delicate task, precision surface mount component placement machines have been developed. While the particular design of the component placement machine is not relevant, all component placement machines generally pick up a component at one location, properly orient the component and place the component in its proper location on the circuit board. The components are not precisely aligned in the component bins where they are picked up. Therefore, gull wing type components may be out of position by as much as plus or minus 50 mils and plus or minus 5 degrees angular orientation. Other type components will be similarly out of position. To obtain proper placement, the orientation and lateral position of the components from the bins must be determined and then corrected prior to placement.

In a surface mount component placement machine, a transport arm picks up the component from a component bin utilizing a vacuum quill. The vacuum gently picks up the component to be placed and transports it between the component bins and the circuit board. The transport arm moves the vacuum quill and the component from the bin to a circuit board located on a work table. Sometime during transport, the angular orientation of the component and the offset of the component from the center of the quill must be determined. During manufacturing, packaging, shipping and loading into a part bin, it is possible for the leads to get slightly bent away from their optimal position. Therefore, the condition of the leads should also be checked to determine whether any are bent or skewed.

Bending or skewing of the leads can result in an improper pitch between adjacent leads (pitch error) or in displacement of the end of a lead from the plane formed by the other leads of the component (coplanarity error). Measurements of pitch error and coplanarity error are needed to ensure that the lowest surfaces of all of the leads are in the same horizontal plane and will make contact with the proper pad on the board when the component is properly oriented. If the errors are too large, alignment of the component will not be sufficient to obtain a functioning connection with the pads of the circuit board, and an electronically defective circuit will result. Components with sufficiently bent leads should be excluded by the placement system.

For components with non-defective leads, any necessary corrections in placement are calculated and the placement head is adjusted to accommodate the corrections based on the calculated offset and angular orientation. The vacuum quill is then precisely lowered to fit the component on the circuit board. In current component placement machines, the transport arm and quill move at approximately one meter per second.

Conventional vision systems used in conjunction with component placement machines for lead position determination use solid state television cameras having a resolution of 512×512 picture elements or pixels. When viewing a two inch component, a corresponding two inch field of view with 512 elements produces a basic resolution of 4 mils or 4 thousandths of an inch. This is not sufficient resolution and, in fact, as pointed out above, it is necessary to achieve a resolution which is at least an order of magnitude greater. One solution is to use several cameras, but the use of several cameras is expensive.

A light based system utilizing one or more focused light sources has been proposed to accurately sense the position and condition of each of the many leads used on integrated circuits prior to their placement on a surface mount circuit board by a pick and place machine. U.S. Pat. Nos. 5,309,223 and 5,331,406, respectively entitled A Laser-Based Semiconductor Lead Measurement System and Multi-Beam Laser Sensor for Semiconductor Lead Measurements, both patents assigned to the assignee of the present invention, describes such a device. Using one, two, three or four light sources, preferably laser diodes, the sensor system can, with the highest degree of resolution, determine lateral orientation and coplanarity of leads for integrated circuit components, even those having an ultrafine pitch.

Determination of the lead position by the above mentioned method is based on the integrated circuit leads occluding the light of one or more precisely directed and focused laser light sources. Each integrated circuit lead is passed through the focal point of a laser beam. The position of each lead is determined by sensing the blockage of all or a portion of the light of the laser beam. Using a two-laser beam system, a coplanarity measurement also can be achieved to determine vertical displacement (height) of any lead.

While this system is reasonably fast, each lead must actually be moved in relation to the focal point of the one or more laser beams. To measure the leads on the four sides of a QFP component, for instance, requires multiple passes through the detection system. The lasers are relatively expensive to purchase and to operate. Furthermore, the sensor system is external to the component placement head, so that the component must be moved to the location of the sensor, which also consumes time.

U.S. Pat. No. 5,278,634, assigned to the assignee of the present invention, entitled A High Precision Component Alignment Sensor System, incorporated herein by reference, discloses a non-contact, laser-based alignment sensor located on the placement head that is utilized to generate the correct angular orientation in the X-Y plane of the component for placement and also to determine electronically any offset of the center of the component with the center of the vacuum quill which carries the component to the circuit board to allow lateral alignment of the component.

The high speed laser-based system disclosed in the '634 patent utilizes a stripe of laser light which is directed horizontally at the component whose alignment is being sensed. The shadow cast by the component is detected by a linear array detector whose data is analyzed to detect the leading edge and the trailing edge of the shadow. This shadow edge information is analyzed at various angular orientations to calculate the proper angular orientation and lateral alignment of the component. The light path cannot be significantly tilted from the horizontal without losing sensitivity.

Copending U.S. patent application Ser. No. 08/289,279, filed Aug. 11, 1994, assigned to the assignee of the present invention, (hereinafter the '279 application) entitled High Precision Component Alignment Systems, incorporated herein by reference, discloses the use of several different optical systems with collimating lenses, condenser lenses, cylinder lenses and telecentric lens systems, in a manner in which substantially more of the light from the light source from previous systems is directed past the component and collected for measurement allowing for a sharper component image on the detector. The use of these optical expedients allows the power requirements on a light source to be reduced by a factor of over one-hundred times over prior systems. With this reduction in required brightness levels, other light sources besides lasers such as light emitting diodes (LEDs) and incandescent bulbs can be used in component alignment.

The systems described by the '634 patent and the '279 application are well suited to the measurement of the orientation of the edges of the component. Furthermore, the entire sensing system can be integrated into the placement head. However, although angular orientation of the component can be achieved with an accuracy of better than 0.03 degrees and lateral positioning of the component can be achieved to an accuracy of better than 0.001 inches, these systems are not designed to precisely locate each of the leads of the component.

To detect any defects in the position of the leads, the light beam, in these systems, can be directed for some components at the leads projecting from the bottom of the component. The shadow cast by the leads is detected by a linear array detector whose data is analyzed to detect a leading edge and a trailing edge of the shadow. The shadow edge detection information is analyzed to obtain the lead position. But problems occur because the light beam is affected by leads on opposite sides of the component since the light beam is projected horizontally. Furthermore, the package standoff can be zero for some components. In that case, a horizontal beam cannot be used to measure the position of the leads because of interference of the beam by the body of the component. Since the system is optimized to measure the orientation of the body of the component, the system is designed to be horizontal within a very small tolerance, i.e. the light path is parallel to the seating plane.

While the prior sensor systems are suitable for handling all types and sizes of components, they have deficiencies either in speed, cost and/or accuracy. What is needed is an economical system which can accurately and rapidly locate leads having 50, 25, 20, 15, 10, and even 4 mil pitch. These systems must have a resolution in the range of at least 0.2 mils. Such a system would allow for much faster determination of lead position and coplanarity of the leads. A preferred system could combine all of these features in a single detection system and would allow a user to improve quality control at low cost, both in capital expenses and production times.

SUMMARY OF THE INVENTION

The present invention provides a relatively low cost, very fast and very accurate system to perform measurements of lead positions and heights which can be used detect pitch errors and coplanarity as well as the precise orientation and lateral position of the leads to allow precise placement on the circuit board. In its preferred embodiments, the alignment detection systems of the present invention is located on the component placement head, so measurements of the leads can be made during transportation of the component to save time. The alignment detection system of the present invention is an optical system with at least one light source and at least one light sensitive detector.

In the preferred embodiments, the detector is a linear or two dimensional array of pixels sensitive to light. A stripe of light is produced to strike this array detector. The placement head contains a measurement space surrounded by the components of the alignment detection system. The light source is oriented to direct light along a path extending across the measurement space. The light path originating at the light source is directed by the optical components across one or more leads in a plane that is neither parallel to nor perpendicular to the seating plane of the component in the proximity of the leads. The light path is directed to extend across the relevant leads without substantial interference from the body of the component or the other leads not being measured. A shadow is produced by the leads which is measured by the array detector. A digital processor analyzes the measurements of the light sensitive detector to determine positions and/or coplanarity of the leads.

BRIEF DESCRIPTION OF THE DRAWINGS

FIG. 3 is a block diagram depicting the interconnection of the processing system of the component detection system, detector array, the quill adjustment mechanism and the controller of the component placement machine;

FIG. 4b is a fragmentary, enlarged, side view of the circuit board component depicted in FIG. 4a;

FIG. 6b is a schematic, top plan view depicting the primary operational parts of the component alignment detection system depicted in FIG. 6a;

FIG. 7b is a schematic, top plan view depicting the primary operational parts of the component alignment detection system depicted in FIG. 7a;

FIG. 9b is a schematic, elevational view depicting the face of the two dimensional detector array of FIG. 9a;

FIG. 11b is a schematic, top plan view depicting the primary operational parts of the component alignment detection system depicted in FIG. 11a;

FIG. 12b is a schematic, top plan view depicting the primary operational parts of the component alignment detection system depicted in FIG. 12a;

FIG. 13b is a schematic, top plan view depicting the primary operational parts of the component alignment detection system depicted in FIG. 13a;

FIG. 14b is a schematic, top plan view depicting the primary operational parts of the component alignment detection system depicted in FIG. 14a.

DESCRIPTION OF PREFERRED EMBODIMENTS

Figure 1:
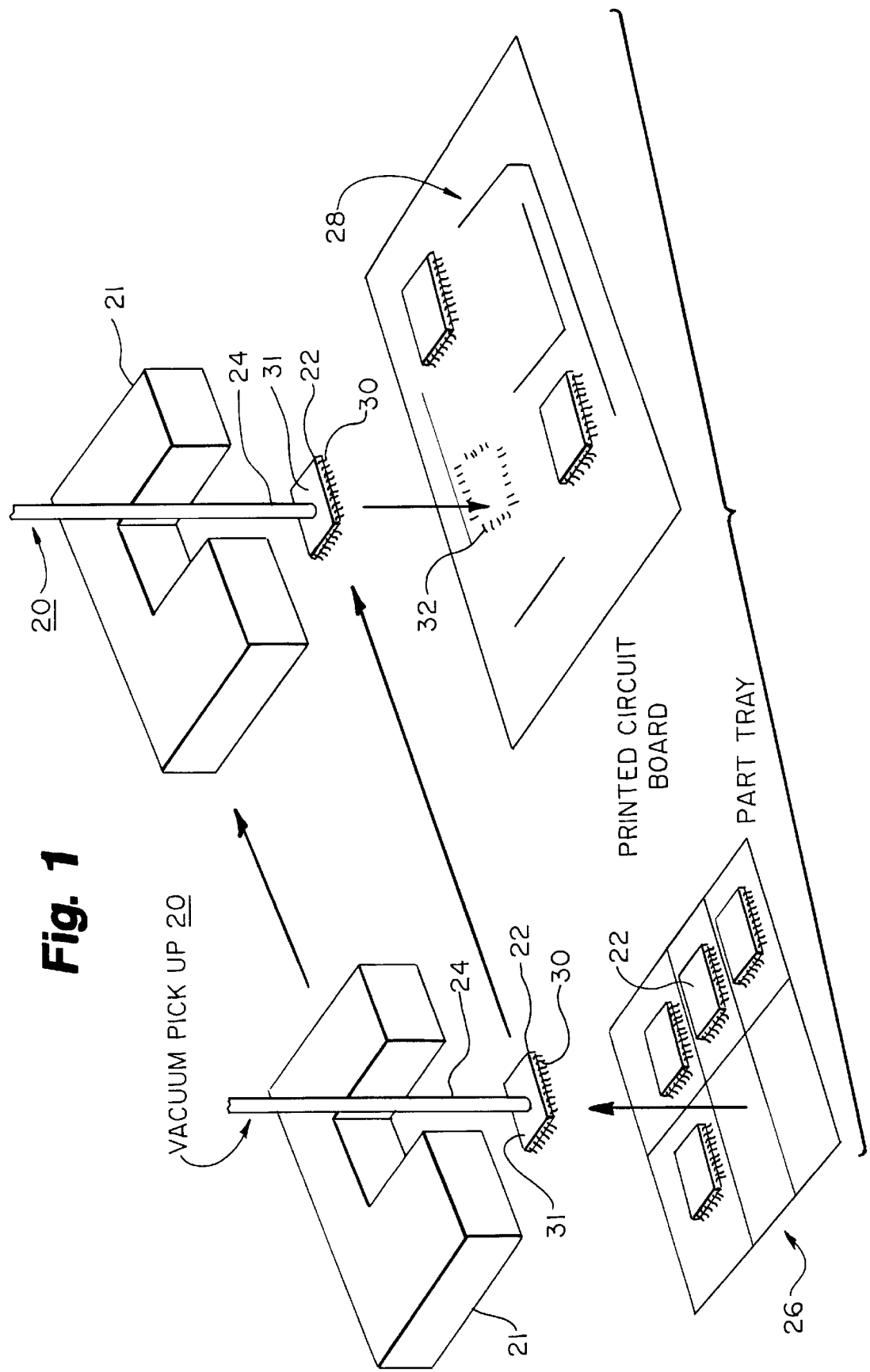
FIG. 1 depicts in schematic form a placement head lifting a circuit board component from a parts tray, with arrows depicting the general direction and sequence of movement of the head and part to a circuit board for placement of the component on the board.

Referring to FIG. 1, a portion of the placement head 20 of a typical component placement system is depicted in schematic form in conjunction with a lead measurement system 21 in accordance with the present invention. The placement head 20 includes a vacuum quill 24 for selectively carrying an electronic component 22. The component 22 has leads 30 and a body 31. With as much speed as possible, the component placement head 20 transports the component 22 from a parts tray 26 to a printed circuit board 28 and precisely places the electronic component 22 in the proper location with its leads 30 precisely placed on the corresponding circuit pads or lines 32 on the circuit board 28. Multiple lead integrated circuit packages are generally releasably held on a strip of tape or in a part tray 26 or a tube (not shown).

Figure 2:
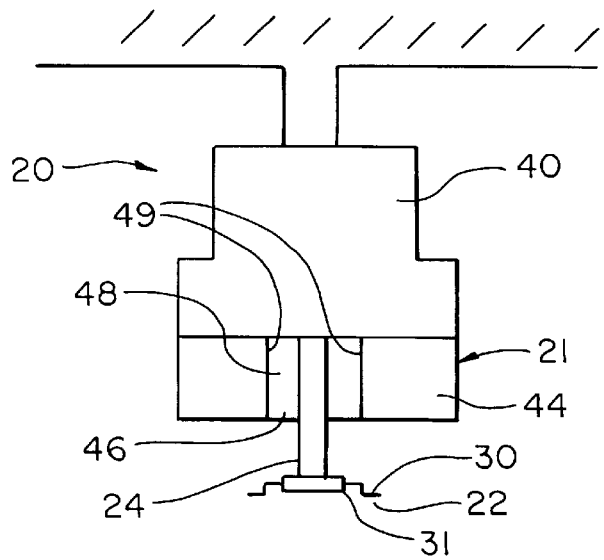
FIG. 2 is a side view of a component placement head.

Referring to FIG. 2, the component placement head 20 includes a quill adjustment mechanism 40 that may be of conventional design. The quill adjustment mechanism 40 provides for holding the component 22 and rotating and retracting the vacuum quill 24.

The lead measurement system 21 is preferably carried just below the quill adjustment mechanism 40. This arrangement is selected for measurements at faster speeds than systems with a lead measurement system not mounted on the placement head without sacrificing accuracy. The lead measurement system 21 has an open space 46 for receiving the quill 24. The quill 24 extends through the space 46 to facilitate retraction of the component 22 into the measurement cavity 48 defined by the interior facing surfaces 49 making up the lead measurement system 21. The lead measurement system 21 of the present invention is suitable for handling all electronic component sizes with which a surface mount component pick and place machine is conventionally used. It will be understood that some of the embodiments of the lead measurement system 21 described below can be effectively used with the lead measurement system 21, not attached to the placement head 20. Then, the lead measurement system 21 and the placement head 20 are brought in close proximity to each other to make the measurements.

Referring to FIG. 3, the lead measurement system 21 includes a light based alignment detection system 44 and a processing system 45. While several embodiments of the light based alignment detection system 44 are described in detail below in conjunction with FIGS. 5–13, each of the embodiments include a light source 54 and an array detector 60. Appropriate optics are selected, as described below, to be placed between the light source 54 and the detector 60. The processing system 45 has an analog-to-digital converter 102 which receives the output from the detector array 60 and sends a digital signal to a digital processor 106, for example an Intel 286 processor. Pixel clock 104 provides the timing information needed by the detector array 60 and the digital processor 106. Digital processor 106 optionally receives input from an angular position encoder and monitor 108 to determine the angular orientation and vertical position of quill 24. This information is necessary in some of the embodiments described below. Angular position encoder 108 receives information on part fixturing 110 from quill adjustment mechanism 40. Output of the digital processor 106 to the component placement machine 20 indicates the X-Y location of the leads 30, the orientation of the component 22 and, optionally, coplanarity information on the leads 30.

Figure 4A:
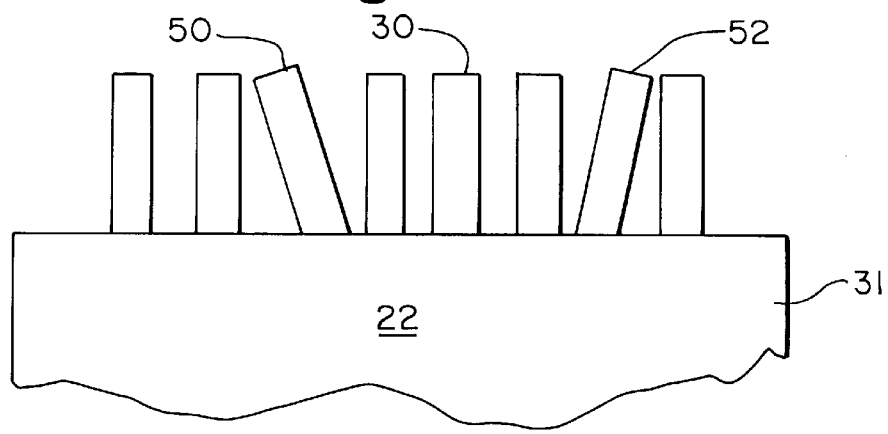
FIG. 4a is a fragmentary, enlarged, plan view of a circuit board component with leads, two of which are bent.

Pitch error can be understood by referring to FIG. 4a. FIG. 4a illustrates a component 22 having leads 30, two of which are bent 50, 52 with resulting pitch error, one 50 with a negative deviation (i.e. trailing its nominal position), and one 52 with a positive deviation. The primary purposes in locating the leads 30 and determining collinearity and/or coplanarity are to align the component to minimize placement error and to eliminate components 22 that have leads 30 so bent that they cannot be aligned within specified tolerances. It is a general design rule of quality assurance that at least 80% of each lead must be accurately placed on the circuit pad which has been created to receive the lead. Therefore, the determination of the position of each lead is a very useful quality of a sensor system.

Figure 4B:
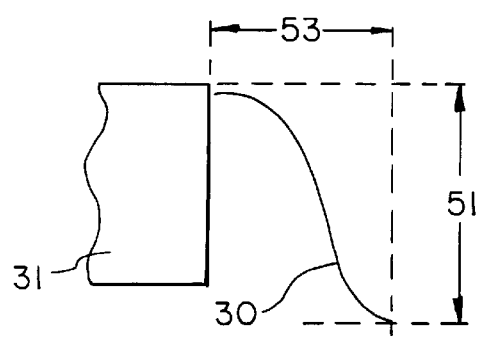

For the leads 30 on parallel sides of the component 22, the largest negative deviation and the largest positive deviation are averaged to get the recommended lateral adjustment for the purposes of placement of the leads 30 on the receiving pads 32 on the circuit board 28. If the adjustment cannot be made within the 80% design rule discussed above, a rejection signal can be generated and the component 22 is rejected for return to the manufacturer. This adjustment should be conducted for both orthogonal sets of leads 30 if the component 22 has leads 30 running at right angles to each other. In addition, one can adjust the orientation of the component 22 to optimize the placement of the leads 30. The measurements of all of the embodiments of the present invention obtain positions of each lead 30. The measurements of some of the embodiments also encompass the calculation of lead heights 51 which are used to obtain collinearity and/or coplanarity estimates. FIG. 4b demonstrates the definition of lead height 51 and lead length 53.

In determining coplanarity, the "Seating Plane" defines how the component will actually sit on the board, but many approximations to the Seating Plane including the "Best Fit Plane" can give a satisfactory estimate of the Seating Plane. The industry standard test for coplanarity uses the Seating Plane methodology established by the Joint Electron Device Engineering Counsel (JEDEC) in Washington, D.C. JEDEC has released a standard (JESD22-B108) entitled Coplanarity Test for Surface-Mount Semiconductor Devices dated November 1991 which defines the Seating Plane of a surface mount part. The JEDEC standard Seating Plane is defined as the plane established by the contact points of three or more leads 30 that support the component 22 when it is placed on top of a planar surface. The deviation from coplanarity is defined as the distance between the intended contact point of a lead 30 and the established Seating Plane. Any device with one or more leads 30 that exceeds a specified deviation (typically 4 mils) from coplanarity shall constitute a failure. The "Seating Plane" can be calculated using the measured lead heights 51 and component geometry.

The Best Fit Plane, on the other hand, is the plane defined to minimize the sum of the squares of the differences in elevation of each lead 30 from that plane (least square fit). While the Seating Plane gives a direct measure of the desired quality, calculations of the Seating Plane display greater standard deviations, i.e. experimental uncertainty, compared with calculations of the Best Fit Plane using the same calculated lead heights 51. Given this uncertainty in calculating the Seating Plane, the calculation of the Best Fit Plane provides a reasonably good estimate of the Seating Plane. The present invention can use either or both of these methods or other approximations to the Seating Plane for determining coplanarity from the measured lead locations.

Collinearity is a measurement of how well the computed heights 51 of the leads 30 on one side of an integrated circuit component 22 fit a line. It can be used as an approximate alternative to coplanarity calculations. In the preferred embodiment, the line used is the best fit line. In this case, the best fit line is a line which minimizes the sum of the squares of the deviations of the heights of the leads 30 from the line. The positive or negative deviation of a single lead 30 from the best fit line can be calculated. Collinearity measurements have the simplicity that height measurements on the various sides of the component do not have to be correlated to obtain a coplanarity estimate. In most cases, the collinearity measurement test will reject integrated circuit components 22 that would also fail a coplanarity test. The collinearity test will fail to reject a part that would fail a coplanarity test only in the case where all the leads 30 on a side are bent together.

Figure 5:
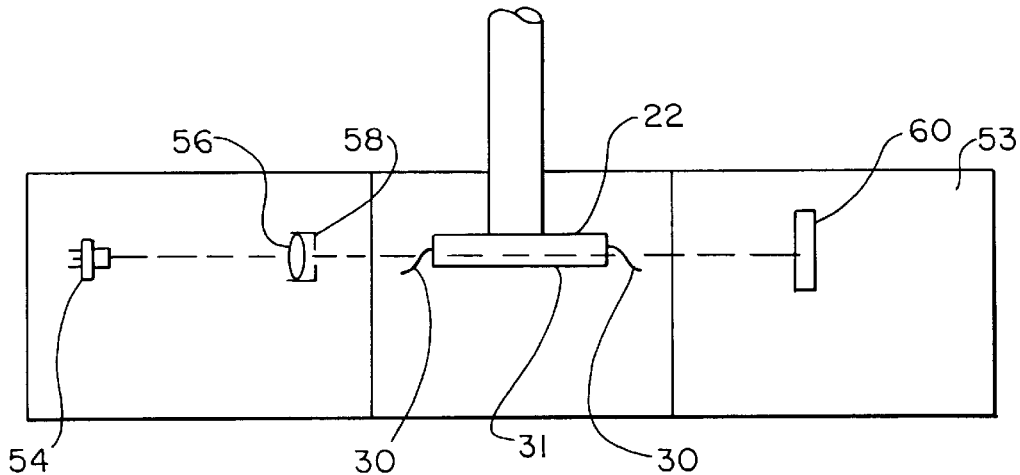
FIG. 5 is a schematic, side elevational view of a prior art component alignment detection system.
Figure 6A:
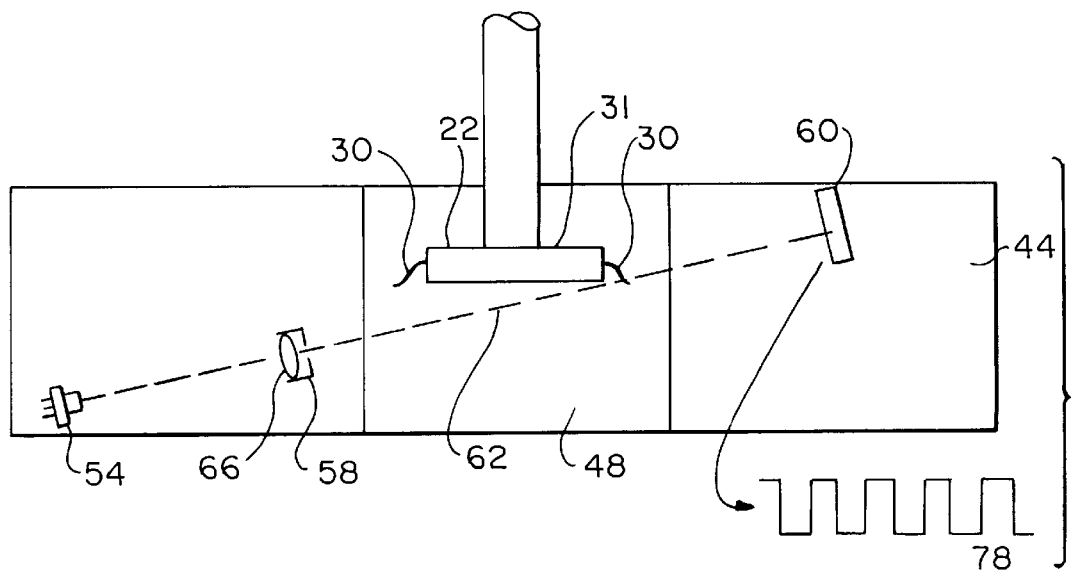
FIG. 6a is a schematic, side elevational view of the component alignment detection system in accordance with the present invention with a representation of the shadow of the component leads, as projected onto the detector, depicted at the lower corner of the figure.
Figure 6B:
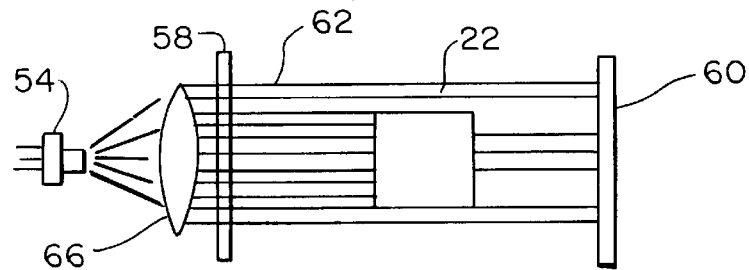
Figure 7A:
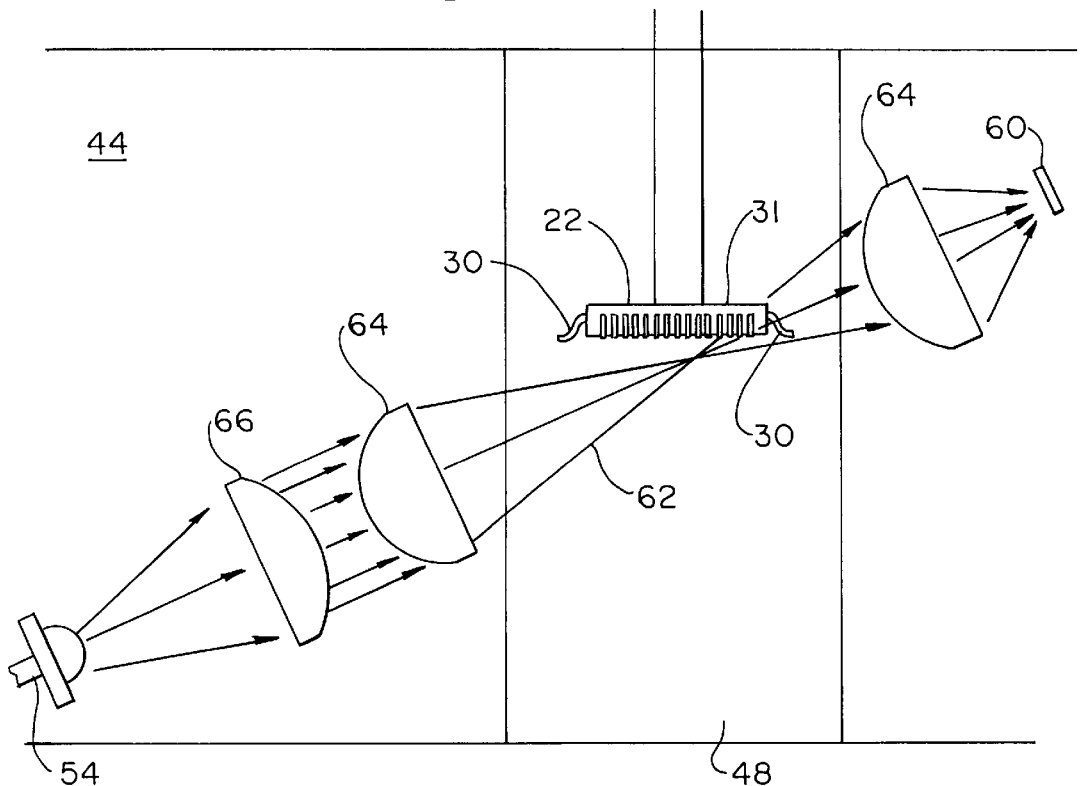
FIG. 7a is a schematic, side elevational view of the component alignment detection system of the present invention, employing an alternative optical component arrangement.
Figure 7B:
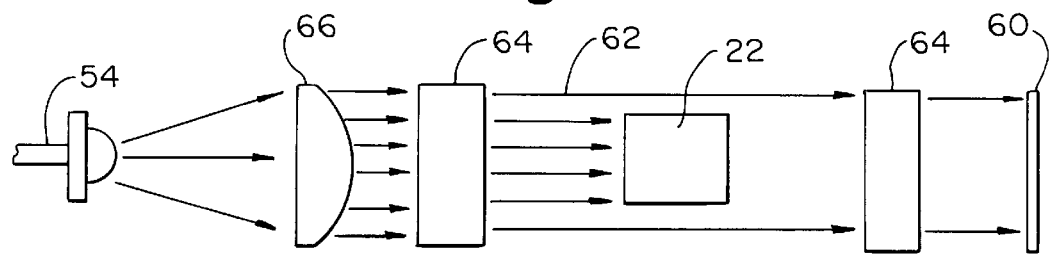

A problem with the use of prior, placement head based sensor systems 53 for lead measurement can be understood with reference to FIG. 5. In the system of FIG. 5, a horizontal light beam, emanating from a light source 54, is passed through a lens 56 and a slit aperture 58 which causes a stripe of light to pass along the component 22 to strike the detector array 60. As can be seen by examining FIG. 5, a clear image of any particular lead 30 is difficult to obtain due to interference from the component body 31 or the leads 30 on the side of the component 22 opposite the lead to be measured. Of course, for components with zero package standoff, the body 31 blocks any view of the leads. Therefore, accurate lead measurements are very difficult or impossible with such prior systems.

In the preferred embodiments of the present invention, at least one light source 54 and detector array 60 are located on the component placement head 20. Either the light source 54 and the detector array 60 are placed respectively on opposite sides of the measurement cavity 48 or a mirror 61 is needed to reflect the light back to the detector on the same side of the measurement cavity as the light source 54. With the component retracted into the measurement cavity 48, the light source 54 and the detector array 60 will be aligned generally with one above the leads 30 of the component 22 and one below the leads 30 to present an angle for the light path 62 relative to the seating plane. It is not critical which is above and which is below the component 22 although design considerations may favor one configuration over the other. Note that mirrors 61 can be used to move the locations of the light source 54 and the detector 60 while presenting the light path 62 in the vicinity of the leads 30 being measured. Preferably interposed between the component 22 and the detector array 60 is an optical filter (not shown) which minimizes the effect of ambient light and any other light which is outside the wavelength of interest.

The resulting light path 62 must allow a clear view of the leads 30 without considerable interference from the body 31 or the leads 30 on another side of the component 22. This requires a nontrivial angle of the light path 62 relative to the seating plane of the component 22. The minimum angle required will depend on the precise dimensions of the placement head 20. Some leads 30 might curl at their ends such that the bottom of the lead 30 relative to the seating plane is not the physical end of the lead 30. If the angle of the light path 62 relative to the seating plane is less than the angle of the curl at the lead tip, the alignment detection system 44 will properly measure the bottom of the lead 30 rather than its end. If the end is measured rather than the bottom, this can result in errors in the calculated lead heights 51 on the order of a mil.

The preferred angle between the light path 62 and the seating plane (typically horizontal) is between 1° and 80°. The more preferred angle between the light path 62 and the seating plane is between 5° and 45°. The even more preferred angle between the light path 62 and the seating plane is between 5° and 30°. The data collected by the detector array 60 is analyzed by processor 45 as described for the various embodiments below to obtain either lead location, lead height 51 (coplanarity) or both.

In a first embodiment, a tilted light beam 62 is directed to pass by the leads 30 on one side of the component 22 relatively unobstructed by the body 31 or the leads 30 on the other sides of the component 22. The light source 54 can be a laser diode, light emitting diode, incandescent bulb or any other source of light. A light path 62 is used that simultaneously strikes all of the leads 30 on one side of a component 22. The light beam 62 is preferentially a stripe or at least directed somewhat specifically at the leads. A stripe of light can be produced using a slit aperture 58 and a collimating lens 66 (FIG. 6) as is described in the '634 patent or using a cylinder lens 64 with a collimating lens 66 (FIG. 7) or using an astigmatic lens (not shown) both as are described in the '279 application. The positions of the cylinder lens 64 and the collimating lens 66 can be reversed. Use of a slit aperture 58 reduces optical and energy efficiency by as much as a factor of 100 or more. If a stripe of light is not used, a condensing lens 68 (FIG. 8) or a collimating lens 66 can be used to direct the light toward the leads. Directing the light with such a lens allows the use of a relatively weak light source 54 even without the collimation of the light beam 62 into a stripe.

Figure 12A:
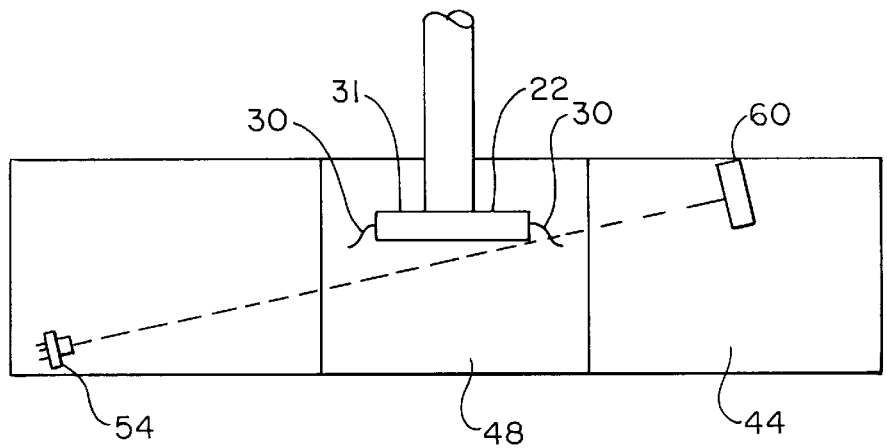
FIG. 12a is a schematic side elevational view of a component alignment detection system in accordance with the present invention having two horizontally displaced light sources.
Figure 12B:
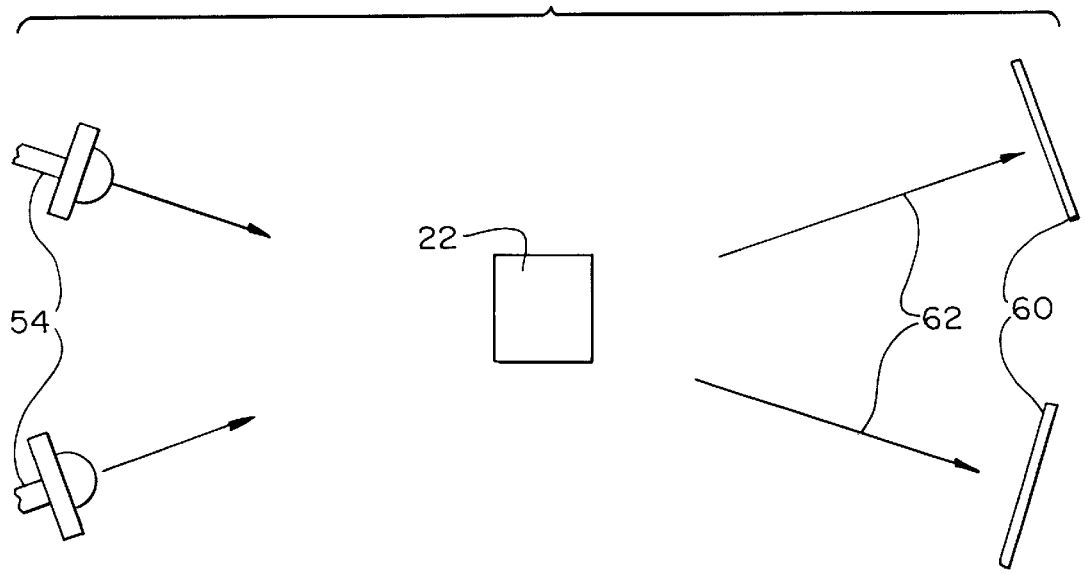

The extent of the light beam 62 is preferably wider than the width of the particular side of the component 22 being measured, although larger components can be accommodated as is discussed in the '634 patent. The beam width can be matched to various length detector arrays 60 by the use of an appropriate lens system (not shown) as is schematically depicted in FIGS. 12b and 12c of the '634 patent. If a collimated stripe of light is not used, it is preferable to use a telecentric lens system 72, as in FIG. 8, between the component 22 and the detector array 60. The telecentric lens system 72 uses a large lens 74 and an aperture 76 to select only a collimated portion of the received light effectively to construct the stripe along the direction shown in FIG. 8b after the shadow is formed.

Figure 8A:
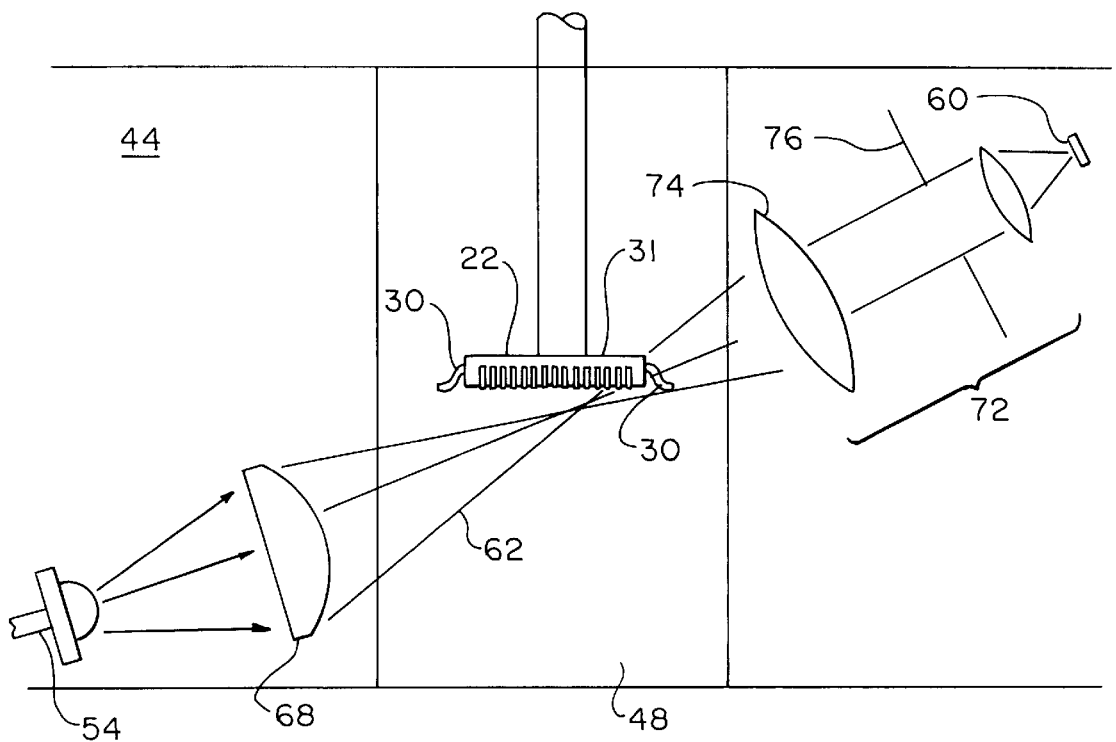
FIG. 8a is a schematic, side elevational view of the component alignment detection system of the present invention employing a lens system between the leads of the component and the detector acting to focus the light onto the detector array along the displayed orientation.
Figure 8B:
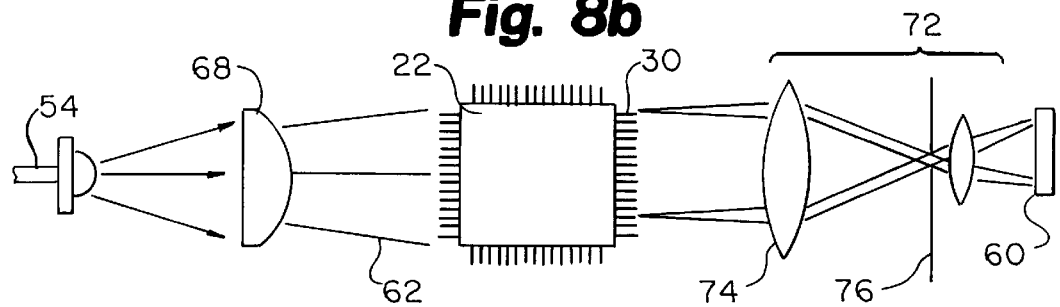
FIG. 8b is a schematic, top plan view depicting the primary operational parts of the component alignment detection system depicted in FIG. 8a with a telecentric lens system acting along the displayed axis to collimate the light beam on the detector side of the light path relative to the component leads.

The shadow 78 (FIG. 6) is cast on the detector array 60 which is made up of closely spaced pixels (not shown) for detecting light. The pixels will detect darkness where leads 30 are blocking the light beam 62 and light where the leads 30 are not blocking the light beam 62, as is shown in FIG. 8. In this way, the lead 30 locations are determined from the center of the shadows 78 measured by the pixels.

If a slit aperture 58 is used to produce the stripe, the slit width will determine the initial thickness of the stripe, and the total intensity will also be effected from the variation of the slit width. If lenses 64, 66 are used to produce the stripe, the thickness will depend on the exact configuration and distances of the optical components since the thickness will generally vary with the distance from the lenses.

The adjustment of the light beam for the detector can be accomplished by altering the way the stripe is produced, by selecting a different detector array 60 or by using astigmatic optics (not shown) just before the detector in the light path 62 to adjust the thickness of the light stripe appropriately for the detector array 60. For example, a thicker stripe can be accommodated by using a linear array of tall pixels for the detector array 60, e.g., DALSA part number IL-C6-2048 with 2048 pixels each 13 µm by 500 µm in dimension. A thin stripe can be used with a thin detector array 60, such as part no. TC104 manufactured by Texas Instruments Corporation which has 3,456 elements, each 10.4 µm (about 0.4 mils) by 10.4 µm, configured along a line with center to center spacing of 10.4 micrometers. An astigmatic lens can also be used to adjust the width of the light stripe to match the detector, if necessary. If a telecentric lens system 72 is used between the component 22 and the detector array 60, this system can be adjusted appropriately to focus the resulting stripe onto the detector array 60.

A related issue is the thickness of the light beam 62 striking the leads 30. A thicker stripe can be produced by using a wider slit aperture 58 or by selecting lenses 54, 56 to have appropriate focal lengths. Thin light beams 62 have the advantage of having higher signal-to-noise because a lead 30 will occlude a greater portion of the light with less likelihood of interference from the body 31. Thick light beams 62 have the advantage that the detection system will be less effected by pick-up errors since the thick beam will be more likely to strike the leads even if the system is in error as the where the leads should be. As discussed below, the choice of the thickness of the light beam 62 will also be influenced by whether the coplanarity of the leads 30 is to be determined, and if it is, by what technique.

It must be noted again that the arrangements of the light source 54 and the detector array 60 and their associated optical components in the light path 62 can be reversed. There are certain advantages, though, in placing the detector array 60 in the light path 62 below the leads 30, i.e. the light path crosses the leads from above. There will typically be a receiving lens (the choices for which are described above) just before the detector 60, and this lens must be as wide as the width of the beam. Low cost, high quality lenses typically have a focal length a factor of two or more longer than the width of the lens. Additional path length is obtained for the same size detection system 44 if the receiving lens is focused on the leads 30 on the far side of the component 22 allowing the use of cheaper optical components.

The use of other optical components and arrangements, such as those described in the '279 application, can also be used effectively in this embodiment. For example, FIGS. 7–11 of the '279 application show optical systems with optical components including in order of position: (1) light source, cylinder lens, component; (2) light source, collimating lens, component, cylinder lens; (3) broad source LED, slit apertures or negative lens, cylinder lens, component, cylinder lens; or (4) small area LED light source, collimating lens, cylinder lens, component, cylinder lens. All of these cylinder lens optical arrangements and others can be used in this embodiment to focus light at an angle past the leads 30 and to project clear sharp shadows 78 of the lead edges on the detector array 60.

Similarly, FIGS. 12 and 14–16 of the '279 application display useful arrangements of optical components including in order of position: (1) collimating lens, component, telecentric lens system, imaging lens; (2) collimating lens, component, gradient index lens; (3) collimating lens, component, imaging lens; (4) collimating lens, component, imaging lens, reflective glass block. As one of ordinary skill in the art will recognize, the precise arrangement of these components can change while still maintaining a similar degree of accuracy and resolution.

Alternately, a two detector system, as disclosed in FIG. 17 of the '279 application, can be used to image the leads from two separate components using one single slanted beam 62. If the components 22 are smaller, the images from the two components 22 can be projected onto one detector 60. These arrangements have a single source 54, two quills 24 for holding and retracting the components 22 into the focused and tilted light beam 62, a focused lens system on the source side to direct as much light as possible past the component, a receiving lens configuration and detector arrays. If two detector arrays 60 are used, one detector array 60 captures the shadow 78 of the leads 30 cast by the first component 22 and the second detector array 60 captures the shadow 78 cast by the leads 30 of the second component 22.

Using the readings of a horizontal, linear detection array 60, the lateral positions of the leads 30 can be obtained. Each pixel produces a voltage reflecting the amount of light striking the pixel. The variation of the voltage by pixel location (FIGS. 6–8) will indicate where the center of the leads 30 are located. One method, that can be used, is the use of a threshold voltage and a comparator or discriminator that converts the analog data from the detector array 60 into a digital representation by detecting when the voltage on each element of the array 60 falls below the threshold voltage thereby indicating that the shadow 78 of the lead 30 has been detected. This process can be repeated for the other sides of the component 22 which have leads 30. The determination of lead 30 position is not sensitive to the alignment of the component 22 on the quill 24 because the measurements from the different sides of the component 22 can be put together to determine the orientation of the component 22 on the quill 24.

It should be noted that plane or curved mirrors can be used in the optical path to fold the optical path allowing a more compact alignment detection system 44. Similarly, a glass block can be used to fold the optical path between the component 22 and detector array 60 as is shown in FIG. 16 of the '279 application.

This embodiment can also be used to obtain a measurement of lead height 51 if a thicker light beam is used to strike the leads 30. Such a thick beam can be produced with a variety of appropriately chosen optics including adaptations of the optics in FIGS. 6–8. The amount of this thick beam occluded from striking the detector array 60 will be related to the projection of the lead 30 orthogonal to the light beam 62. This can be calibrated by lowering a knife edge with a well defined edge into the beam and obtaining measurements at different heights. The intensity measured by the pixels partially within the shadow of the specific lead 30 will be related to the amount of the thick beam occluded. Therefore, the output of the pixel indicating the intensity of light measured reflects the projection of the lead 30 perpendicular to the light path 62. If the length 53 of the lead 30 is assumed, then the height 51 (i.e. the orientation) of the lead 30 can be determined by straightforward geometry.

Figure 9A:
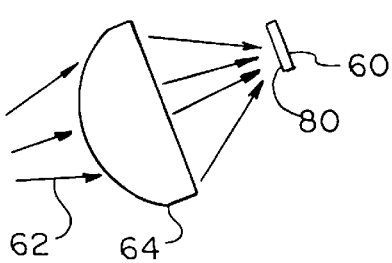
FIG. 9a is a fragmentary, schematic, side elevational view of the portion of the component alignment detection system in accordance with the present invention having a two dimensional detector array.
Figure 9B:
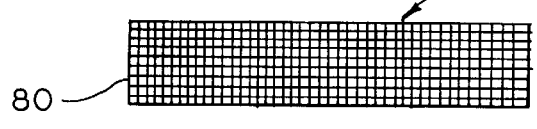

Lead heights 51 can also be measured using a detector array 60 with a two dimensional array of pixels 80 placed with its long dimension along a horizontal line, as shown in FIG. 9. An example of such a detector 60 is a 2048 pixel by 96 pixel device made by Dalsa (Dalsa part number IL-E1-2048). An advantage of using a two dimensional array 80 is that the lead 30 position can be determined from the horizontal variation in intensity measured by the pixels and the projection of the leads 30 can be determined from the variation in intensity measured by the pixels along the short dimension of the detector array as caused by the shadow 78 of the leads 30. Again, this yields the projection of the lead 30 perpendicular to the light path 62. The height 51 is obtained if the lead length 53 is assumed. The two dimensional detector 80 has a greater cost. But height 51 measurements using the two dimensional array 80 are more accurate because the, measurements are not as sensitive to the linearity of the individual pixel's response to light and to the pixel's signal to noise ratio as are the intensity based measurements.

The above measurements of lead height 51 have required the input of the lead length 53. Lead length 53 can be obtained using a second measurement after a slight rotation of the component 22 by the component placement head 20. The rotation can range from 1° to 30° and preferably from 5° to 10°. The optimum angle is determined from the pixel resolution (e.g., 0.05 mils) and the resolution of the rotary encoder 108 (typically, 0.01° to 0.005°). The projection of the leads 30 along the perpendicular to the light path 62 (as measured by any of the above techniques) will change with the slight rotation of the component 22. Also, the lateral extent of the image 78 will shift because of the rotation. Both of these changes will be related to the length of the lever arm. Therefore, the two measurements of the projection of the lead 30 along the perpendicular to the light path 62 can be combined to obtain the lead length 53 and lead height 51.

A second embodiment requires a thin stripe of light (FIG. 6, with an appropriately chosen slit aperture 58) or a thinly focused stripe of light (FIG. 7, with appropriately chosen lens 64, 66) and a detector array 60 made up of a horizontal, linear array of pixels. The production of the stripe of light and the linear array of pixels are described above with respect to the first embodiment. The distinguishing feature of this embodiment is that the component 22 is moved vertically (orthogonal to its seating plane) such that the leads 30 move through the angularly directed light beam 62. In this way, the projection of the lead 30 perpendicular to the light path 62 can be determined from the timing of the shadow 78 falling on the detector array 60. See FIG. 10, which has the optical components other than the light source 54 and the detector 64 removed to emphasize the distinguishing features of this embodiment. Taking measurements at different heights, e.g., P1, P2, P3, builds up a two dimensional image of the component 22. See FIGS. 10a and 10b.

The two dimensional image constructed by this method is identical to the two dimensional image constructed with the two dimensional horizontal array. Instead of using a thick light stripe to measure the projections of the leads 30 perpendicular to the beam 62, the component 22 is moved through the beam 62 to sample the same projections. Because it cannot be determined where the lead 30 is interrupting the light beam 62, the measurement requires an assumption of the lead length 53 to obtain the lead height 51. Since placement heads 20 typically are designed already for vertical movement of the component 22, this method has the sensitivity advantages of the two dimensional array detector 80 without the added cost to purchase the two dimensional detector 80. This method, though, has the disadvantage of being potentially slower because of the time needed to move the component 22 relative to the beam 62.

Figure 10A:
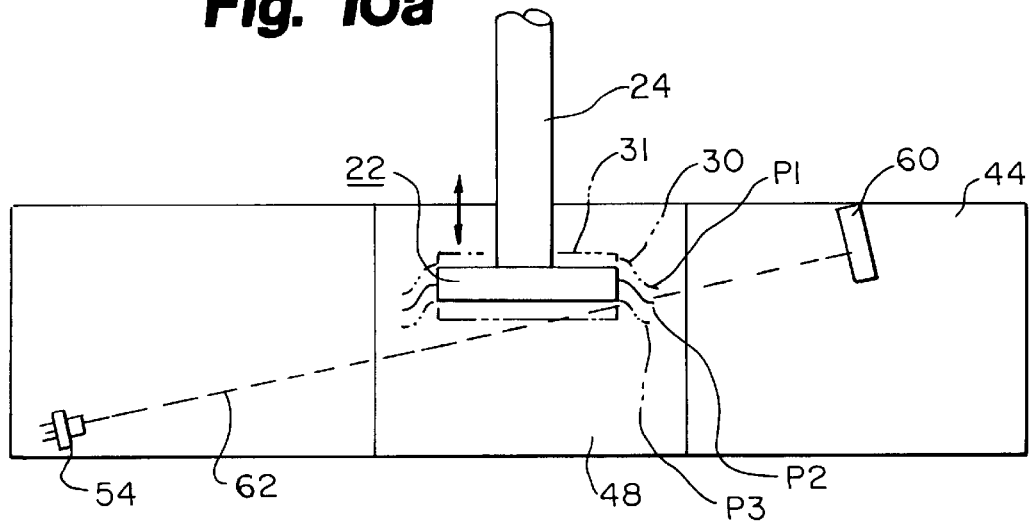
FIG. 10a is a schematic, side elevational view of an alternative embodiment of the component alignment detection system according to the present invention in which measurements are taken with the component at different vertical heights, with arrows depicting the vertical motion of the component and phantom lines depicting the component at different heights, and with optical components other than the light source and detector omitted for clarity.
Figure 10B:
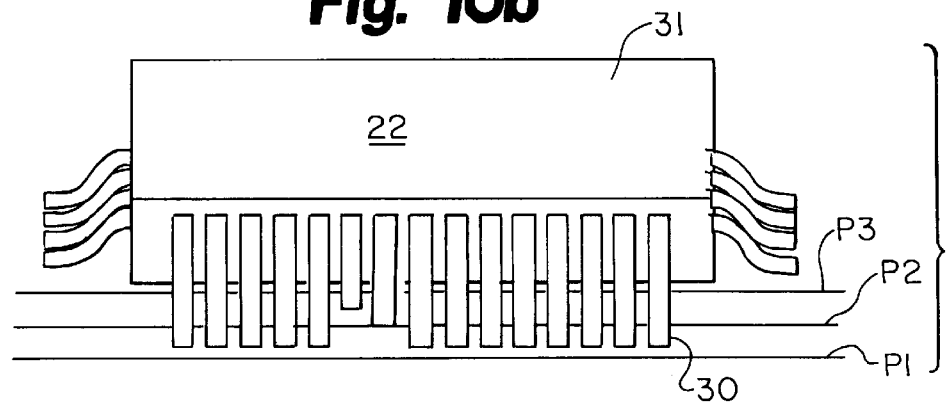
FIG. 10b is a schematic, side elevational view of a component positioned within the component alignment detection system of FIG. 10a, with lines indicating different portions of the leads struck by the light beam when the component is at different vertical heights.
Figure 10C:
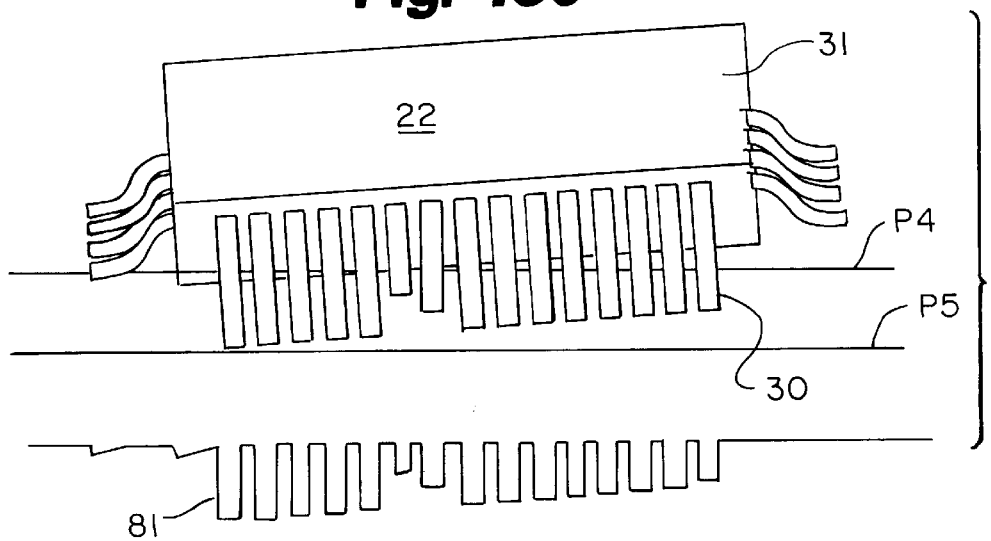
FIG. 10c is a schematic, side elevational view of a component positioned within the component alignment detection system of FIG. 10a, but with the component depicted as tilted on the placement head, and with a schematic representation of the two dimensional image produced upon moving the component through the light beam depicted in the lower portion of the figure.

This embodiment also solves several potential problems that can occur in the measurement of lead 30 position with the use of a thin stripe of light. Aiming the thin stripe of light can be difficult without hitting either the body 31 (as in path P4 in FIG. 10c) or missing the leads 30 (as in path P5) if the component 22 is not perfectly positioned on the vacuum quill 24. Therefore, all leads 30 may not be visible at all vertical heights of the component 22. This problem is multiplied if the component 22 is slightly tilted on the vacuum quill 24 as in FIG. 10c because many heights of the component 22 will have the light beam 62 either missing certain leads 30 or placing some of the leads 30 in the shadow of the body 31. Taking measurements at different vertical heights allows the pooling of measurements at the different heights to construct a two dimensional view 81 as shown in FIG. 10c.

Again, the need for knowing the lead length 53 can be eliminated by having multiple views differing by a slight rotation of the component 22. To have multiple views at each point in the two dimensional array of measurements, the two orientations should be measured at each vertical height as the component 22 is moved. Obtaining the lead length 53 and the lead height 51 follows in exactly the same way as with the first embodiment.

Figure 11A:
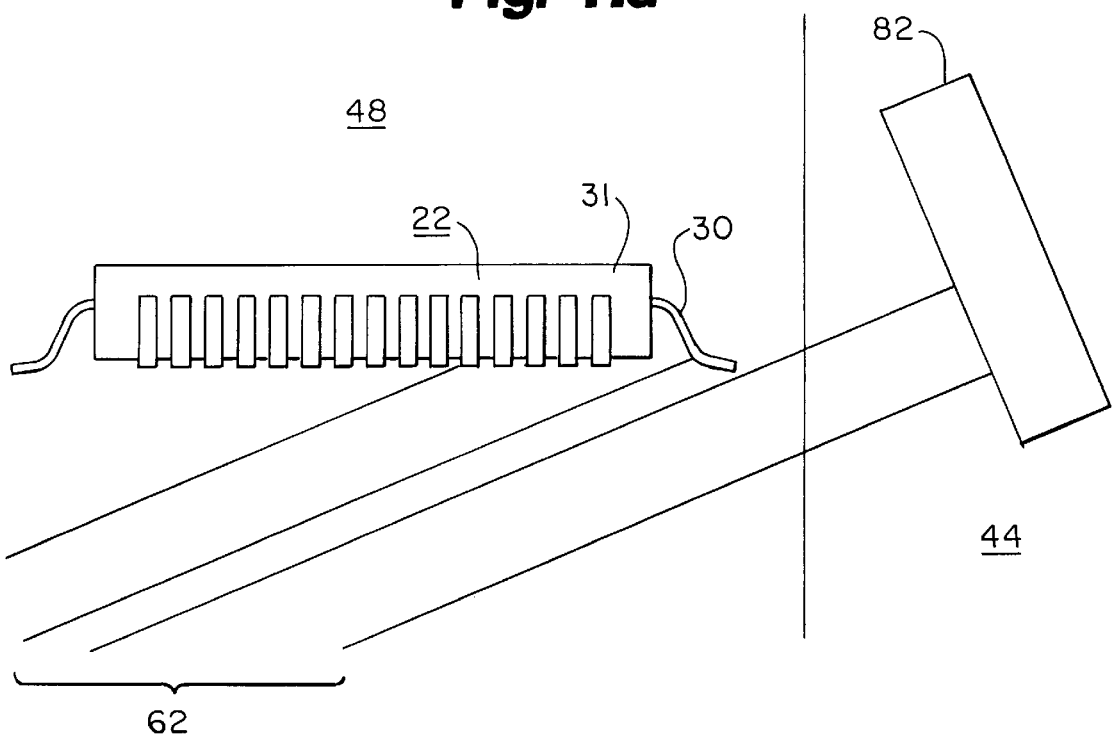
FIG. 11a is a schematic side elevational view of a component alignment detection system in accordance with the present invention having a linear detector in a vertical plane.
Figure 11B:
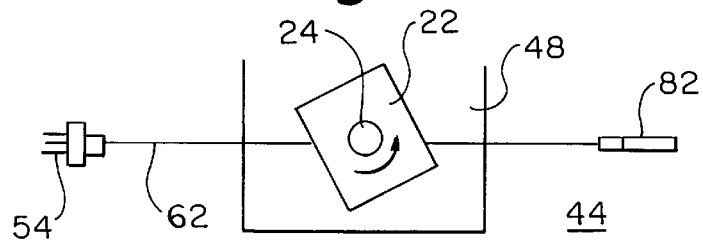

A third embodiment uses a linear detector array 82 where the length of the one dimensional array detector 82 lies in a vertical plane (orthogonal to the seating plane) as displayed in FIG. 11a. In this embodiment, a stripe of light must be used that is oriented to strike along the length of the detector 82. The various optical arrangements from the first embodiment can be appropriately adapted to accomplish this task of producing a vertical stripe rather than a horizontal stripe. For example, a slit aperture 58 can be used to produce a stripe as in FIG. 6 with the slit appropriately oriented, or a cylinder lens 64 and a collimating lens 66 can be used to focus a stripe of light as in FIG. 7 or a telecentric lens system 72 can be used to produce an appropriate stripe of light after the component 22 in the light path 62. Many of the comments in the description of the first embodiment about adapting the light source 54, the optical components and the detector 60 to function properly together are equally relevant to the situation where a vertical, linear detector 82 is used.

A vertical, linear detector 82 should be selected to measure at most a single lead 30 at a time. See FIGS. 11a and 11b. Such a reading will give the projection of the lead 30 perpendicular to the light path 62. If the lead length 53 is assumed, the lead height 51 can be obtained, To measure the heights 51 of the other leads 30, the component 22 is rotated as in FIG. 11a. The amount of rotation needed to place the lead 30 in the light Path 62 provides a measure of the lead 30 position. The vertical projection of the light stripe must be sufficiently large that all of the leads 30 will be in a portion of the light beam 62 as the component 22 is rotated without any of the leads 30 missing the beam 62 all together or the body 31 blocking all of the beam 62.

The depiction of this embodiment in FIG. 11 and of the remaining embodiments in FIGS. 12–15 have all of the optical components other than the light source 54 and the detector 60 or 82 removed to focus on the distinguishing features of the embodiments. Many variations on the lenses, slits, etc. between the light source 54 and the detector 60 or 82 can be used successfully. A person skilled in the art will be able to select appropriate optical components based on the description above and the description in the cited references.

A fourth embodiment uses two or more light sources 54 each horizontally displaced from its counterparts as displayed in FIG. 12. The light path 62 of each light source 54 is designed to strike all of the leads 30 on one side of the component 22 without significant interference from the leads 30 on the other side of the component 22 or from the body 31. The light sources 54 can be directed at separate detector arrays 60, or with the proper selection of detector size and optics, they can be projected at the same detector 60. Essentially each optical system (one light source 54, the appropriate detector 60 and associated optics) functions as in the first embodiment. All of the various choices for optics and detectors 60 from the first embodiment apply equally for this embodiment as long as the selections are capable of measuring the projection of the lead 30 along the particular light path 62.

Various techniques can be used to minimize interference between the two measurements. For example, the measurements can be made sequentially in time with a slight delay between the two measurements. Also, light sources 54 with different frequency ranges can be used with two separate detectors 60. A band pass filter (not shown) appropriate for the particular light source 54 can be placed in front of the appropriate detector 60. These techniques minimize the effects of the scattering of the light from one source 54 into the detector 60 measuring light from the other light source 54.

Using these two horizontally separated light sources 54 is equivalent to obtaining two views of the leads by rotating the component 22, and the calculation of lead lengths 53 and lead heights 51 follow identically. This embodiment offers the advantage of being faster because the component 22 does not have to be rotated. Taking two different views with two light sources 54 even with one detector 60 is very fast. This embodiment has the disadvantage of increase costs because of the additional hardware.

A fifth embodiment also uses two or more horizontally displaced light sources 54. In this embodiment, the projection of the lead lengths along the light paths 62 are obtained by the vertical motion of the component as in the second embodiment above. See FIGS. 10 and 12 to understand the features that are combined in this embodiment. The use of the two horizontally displaced light sources 54 allows the measurement of the components 22 from two orientations without the need for rotating the component 22. This embodiment is a variation on the second embodiment in the same way that the fourth embodiment is a variation of the first embodiment. Again, the calculation of the lead lengths 53 and the lead heights 51 are obtained in an identical way as the calculations based on two sightly rotated views in the second embodiment.

Figure 13A:
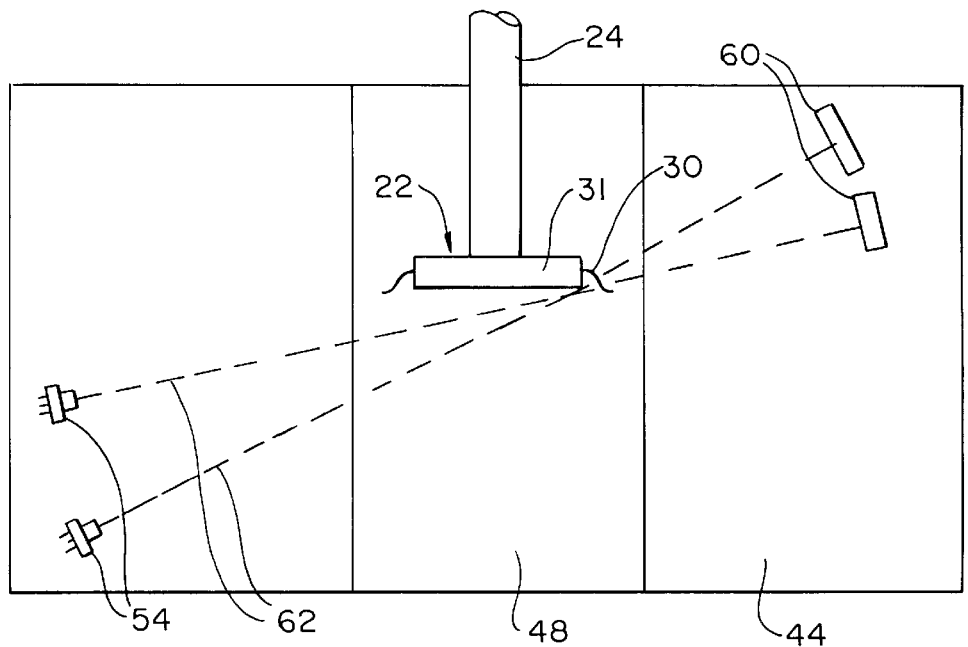
FIG. 13a is a schematic side elevational view of a component alignment detection system in accordance with the present invention having two vertically displaced light sources.
Figure 13B:
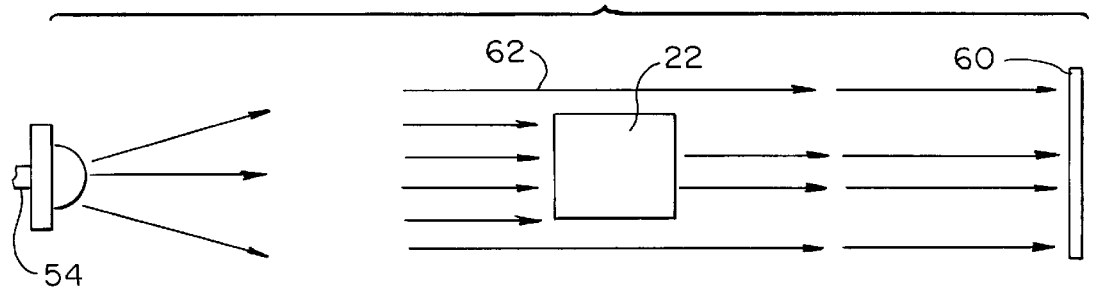

Referring to FIG. 13, a sixth embodiment uses two or more light sources 54 in a vertical plane. Either intensity measurements with a horizontal linear detector 60 or measurements of a detector 60 with a two dimensional array of pixels 80 can be used to obtain projections of the lead 30 perpendicular to each of the light paths 62. The light path 62 of each light source 54 is designed to strike all of the leads 30 on one side of the component 22 without significant interference from the leads 30 on the other side of the component 22 or from the body 31. The light sources 54 can be directed at separate detectors 60, or with the proper selection of detector size and optics, they can be projected at the same detector 60. Essentially each optical system (one light source 54, the appropriate detector 60 and associated optics) functions as in the first embodiment. All of the various choices for optics and detectors 60 from the first embodiment apply equally for this embodiment as long as the selections are capable of measuring the projection of the lead 30 along the particular light path 62. Having two light sources 54 vertically displaced from each other provides the projection of the leads 30 perpendicular to two separate light paths 62. Simple geometry then allows the calculation of the lead height 51 without any assumptions of the lead lengths 53.

A seventh embodiment also uses two or more vertically displaced light sources 54. In this embodiment, the projection of the leads 30 along the light paths 62 are obtained by the vertical motion of the component 22. See FIGS. 10 and 13 to understand the features combined in this embodiment. The use of the two vertically displaced light sources 54 provides two projections of each lead 30 when the vertical displacement of the component 22 is completed. The two projections allow the calculation of the lead heights 51, without the need to assume the lead length 53. This embodiment is a variation on the second embodiment in the same way that the sixth embodiment is a variation of the first embodiment.

Figure 14A:
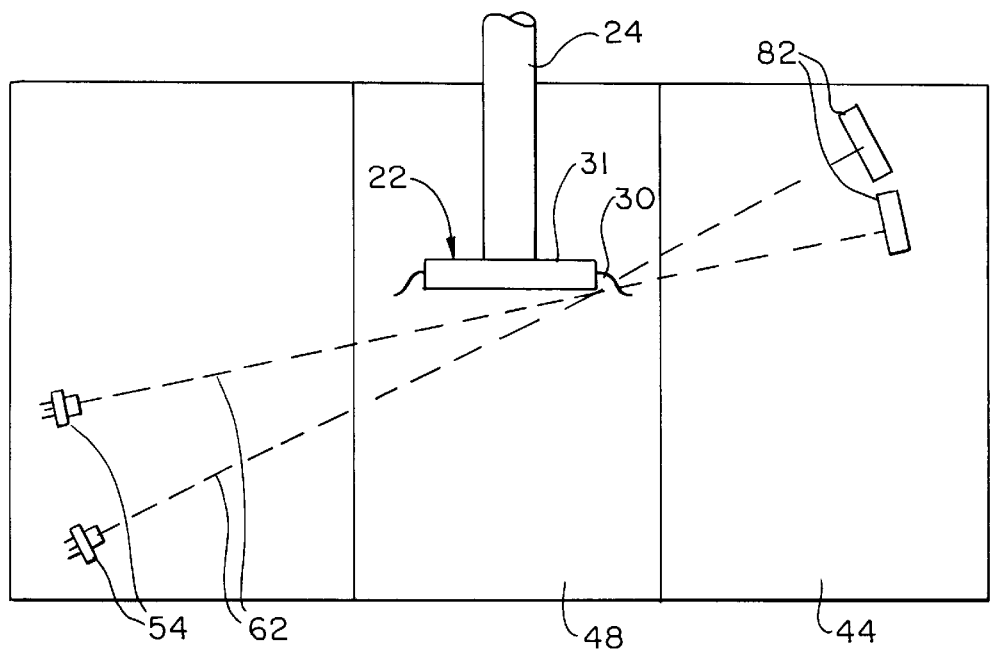
FIG. 14a is a schematic side elevational view of a component alignment detection system in accordance with the present invention having two vertically displaced light sources and a vertical linear array detector.
Figure 14B:
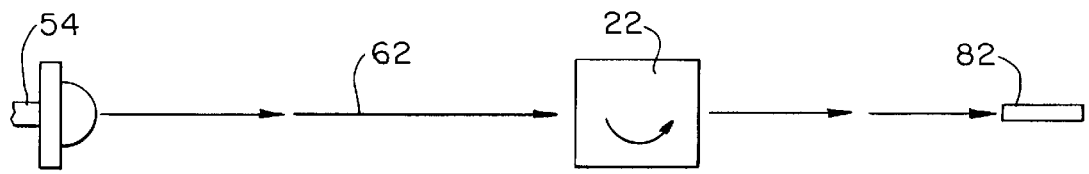

Referring to FIG. 14, an eighth embodiment uses two vertically displaced light sources 54 with vertical, linear detector arrays 82. The light sources 54 can be directed at separate detectors 82, or with the proper selection of detector size and optics, they can be projected at the same detector 82. Essentially each optical system (one light source 54, the appropriate detector 82 and associated optics) functions as in the third embodiment above. Each lead 30 is measured one at a time. The component is rotated to determine lead position and to bring the leads 30 into the light paths 62 to measure lead heights 51. The use of the two vertically displaced light sources 54 provides two projections of each lead 30 when the lead 30 is rotated into the light paths 62. The two projections allow the calculation of the lead heights 51 without the need to assume the lead length 53. This embodiment is a variation on the third embodiment in the same way that the sixth embodiment is a variation of the first embodiment.

Figure 15:
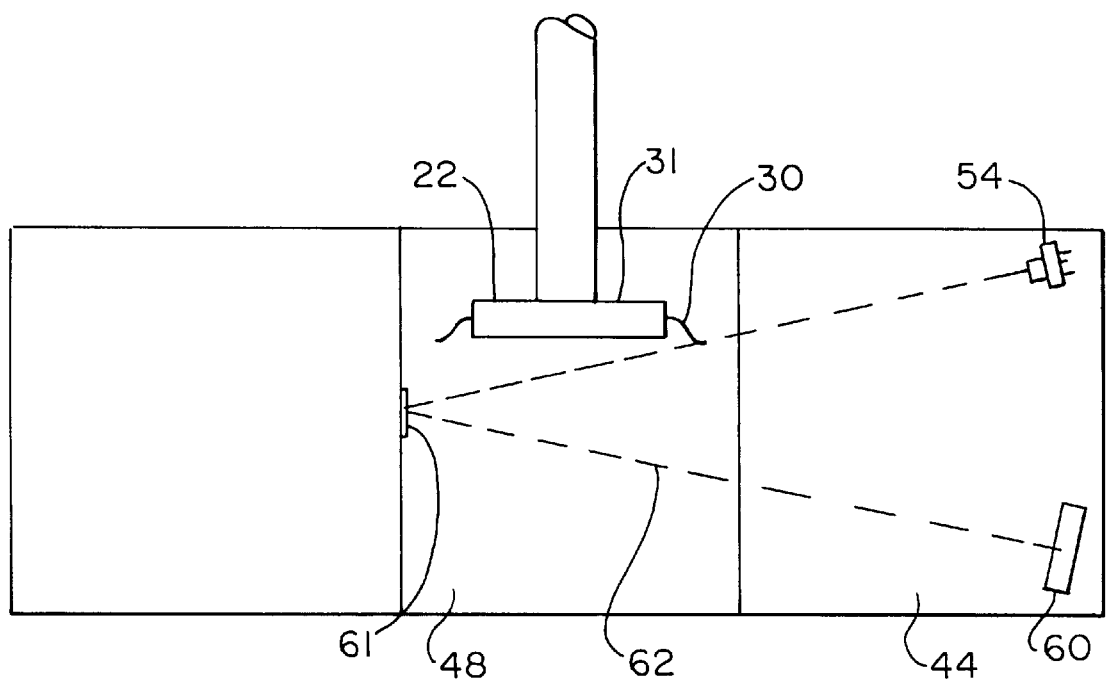
FIG. 15 is a schematic side elevational view of the component alignment detection system in accordance with the present invention with a mirror to fold the light path to allow the placement of the light source and detector array on the same side of the alignment detection system.

A ninth embodiment has both the light source 54 and the detector array 60 on the same side of the alignment detection system 44 with a mirror 61 or other reflective component (not shown) used on the opposite side of the measurement cavity 48 to fold the light path 62 as depicted in FIG. 15. Use of the mirror 61 allows a longer light path 62 between the component 22 and the detector array 60 without needing a longer alignment detection system 44 since the light transverses the measurement cavity 48 twice. Also, housing the light source 54 and detector 60 on the same side of the alignment detection system 44 allows simplified electrical wiring and optical alignment. Use of the mirror 61, as depicted in FIG. 15, can be effectively used in combination with any of the above embodiments and appropriately selected optics.

We claim:

1. A method for the non-contact measurement of an electronic component having a body and a plurality of leads extending from the body, the measurement of the electronic component including the determination of the height of at least one lead of the component, the method comprising:

providing a light source and a detector;

developing light from the light source into a beam of light, the beam of light striking at least one of the leads and extending to the detector;

focusing the beam of light at a point off the plurality of leads such that the beam of light has substantial thickness at the at least one lead;

partially occluding the beam of light with the at least one lead struck by the beam of light;

detecting with the detector the partially occluded beam of light to produce a detector signal;

providing the length of the at least one lead; and determining the height of the at least one lead using the length of the at least one lead and the detector signal.

2. The method of claim 1, wherein the beam of light comprises two wedges of light, the two wedges of light being joined at the point of focus off the plurality of leads.

3. The method of claim 1, wherein the beam of light is focussed by a collimating lens and a cylinder lens located between the light source and the point of focus off the plurality of leads.

4. The method of claim 1, wherein the beam of light is focussed by a telecentric lens system located between the point of focus and the detector.

5. The method of claim 4, wherein the telecentric lens system selects only a collimated portion of the beam of light to pass to the detector.

6. The method of claim 1, wherein the length of the at least one lead is assumed.

7. A method for the non-contact measurement of an electronic component having a body and a plurality of leads extending from the body, the measurement of the electronic component including the determination of the height of at least one lead of the component, the method comprising:

provided a light source and a detector, a length of the detector having a vertical component;

developing light from the light source into a sheet of light, the sheet of light defining a substantially vertical plane, the sheet of light striking at least one of the leads and extending to the detector;

partially occluding the sheet of light with the at least one lead struck by the sheet of light;

detecting with the detector the partially occluded sheet of light to produce a detector signal;

providing the length of the at least one lead; and determining the lead height of the at least one lead using the length of the at least one lead and the detector signal.

8. The method of claim 7, wherein the sheet of light strikes a single lead of the plurality of leads at a time.

9. The method of claim 8, further comprising rotating the component in the sheet of light to determine the height of at least one other lead.

10. The method of claim 7, wherein the length of the at least one lead is assumed.

11. A device for non-contact measurement of an electronic component having a body and a plurality of leads extending from the body, the device comprising:

a light source, the light source being adapted to develop a beam of light and direct the beam of light such that the beam of light is partially occluded by at least one lead of the component;

a detector, the detector being adapted to receive the partially occluded beam of light from the light source to produce a detector signal;

focussing apparatus, the focussing apparatus being adapted to focus the beam of light at a point off the plurality of leads such that the beam of light has substantial thickness at the at least one lead; and processing apparatus, the processing apparatus being adapted to determine the height of the at least one lead using the length of the at least one lead and the detector signal.

12. The device of claim 11, wherein the focussing apparatus comprises at least one collimating lens and at least one cylindrical lens.

13. The device of claim 11, wherein the processing apparatus is adapted to determine coplanarity of the leads of the electronic component.

14. The device of claim 11, further comprising a telecentric lens system located between the point of focus and the detector.

15. The device of claim 11, in combination with a surface mount component placement machine having a quill for holding the component between the light source and the detector in the beam of light.

16. A device for non-contact measurement of an electronic component having a body and a plurality of leads extending from the body, the device comprising:

a light source, the light source being adapted to develop a sheet of light defining a substantially vertical plane and to direct the sheet of light such that the sheet of light is partially occluded by at least one lead of the component;

a detector, the detector being adapted to receive the partially occluded sheet of light from the light source to produce a detector signal;

processing apparatus, the processing apparatus being adapted to determine the height of the at least one lead using the length of the at least one lead and the detector signal.

17. The device of claim 16, wherein the sheet of light strikes a single lead of the plurality of leads at a time.

18. The device of claim 16, wherein the processing apparatus is further adapted to determine the height of at least one other lead upon rotation of the component in the sheet of light.

19. The device of claim 16, in combination with a surface mount component placement machine having a quill for holding the component between the light source and the detector in the sheet of light.

* * * * *